US010622503B2

(12) United States Patent
Iyer et al.

(10) Patent No.: US 10,622,503 B2
(45) Date of Patent: Apr. 14, 2020

(54) SOLAR ANTENNA ARRAY FABRICATION

(71) Applicant: NovaSolix, Inc., Palo Alto, CA (US)

(72) Inventors: Jyotsna Iyer, Saratoga, CA (US); Paul Comita, Menlo Park, CA (US); Robert E. Cousins, Saratoga, CA (US); Laurence H. Cooke, Los Gatos, CA (US)

(73) Assignee: NovaSolix, Inc., Newark, CA (US)

( * ) Notice: Subject to any disclaimer, the term of this patent is extended or adjusted under 35 U.S.C. 154(b) by 33 days.

(21) Appl. No.: 15/661,854

(22) Filed: Jul. 27, 2017

(65) Prior Publication Data

US 2018/0026149 A1  Jan. 25, 2018

Related U.S. Application Data

(63) Continuation-in-part of application No. 15/411,396, filed on Jan. 20, 2017, which is a continuation-in-part
(Continued)

(51) Int. Cl.
*H01L 31/054* (2014.01)
*H01L 31/02* (2006.01)
(Continued)

(52) U.S. Cl.
CPC ........ *H01L 31/054* (2014.12); *H01L 31/0201* (2013.01); *H01L 31/035281* (2013.01);
(Continued)

(58) Field of Classification Search
CPC ......... H02S 10/00; H02S 40/32; Y02E 10/52; H01Q 1/248; H01L 31/054;
(Continued)

(56) References Cited

U.S. PATENT DOCUMENTS 5,043,739 A  8/1991 Logan et al.
7,354,877 B2  4/2008 Rosenberger et al.
(Continued)

FOREIGN PATENT DOCUMENTS

CN   102171811 A    8/2011
FR       2996681 A1 *  4/2014  ......... H01L 51/4206
(Continued)

OTHER PUBLICATIONS

Machine translation of FR-2996681-A1, Costel-Sorin. (Year: 2014).*
(Continued)

*Primary Examiner* — Mayla Gonzalez Ramos
(74) *Attorney, Agent, or Firm* — Panitch Schwarze Belisario & Nadel LLP

(57) ABSTRACT

A solar antenna array may comprise an array of carbon nanotube antennas that may capture and convert sunlight into electrical power. A method for constructing the solar antenna array from a glass top down to aluminum over a plastic bottom such that light passing through the glass top and/or reflected off the aluminum both may be captured by the antennas sandwiched between. Techniques for patterning the glass to further direct the light toward the antennas and techniques for continuous flow fabrication and testing are also described.

8 Claims, 17 Drawing Sheets

Related U.S. Application Data of application No. 15/249,953, filed on Aug. 29, 2016, now abandoned, which is a continuation-in-part of application No. 15/133,807, filed on Apr. 20, 2016, now abandoned.

(51) Int. Cl.

| | | |
|---|---|---|
| *H01L 31/048* | (2014.01) | |
| *H01L 51/00* | (2006.01) | |
| *H01L 31/0352* | (2006.01) | |
| *H01L 31/07* | (2012.01) | |

(52) U.S. Cl.
CPC ........ *H01L 31/048* (2013.01); *H01L 31/0543* (2014.12); *H01L 31/0547* (2014.12); *H01L 31/07* (2013.01); *H01L 51/0048* (2013.01); *Y02E 10/52* (2013.01)

(58) Field of Classification Search
CPC ............. H01L 31/0543; H01L 31/0201; H01L 31/0547; H01L 31/035281; H01L 31/048; H01L 31/09; H01L 31/1085; H01L 31/108; H01L 31/0475; H01L 31/056; H01L 31/0465; H01L 31/028; H01L 31/06; H01L 31/07; H01L 31/022425; H01L 51/0048; Y02P 70/521
See application file for complete search history.

(56) References Cited

U.S. PATENT DOCUMENTS

| | | | |
|---|---|---|---|
| 7,354,977 | B1 | 4/2008 | Woods et al. |
| 7,431,965 | B2 | 10/2008 | Grigorian et al. |
| 7,431,985 | B2 | 10/2008 | Iwama |
| 7,679,057 | B2 | 3/2010 | Gritz et al. |
| 7,679,957 | B2 | 3/2010 | Ma et al. |
| 7,687,160 | B2 | 3/2010 | Winarski |
| 7,744,793 | B2 | 6/2010 | Lemaire et al. |
| 8,137,653 | B1 | 3/2012 | Predtechensky et al. |
| 2004/0085247 | A1 | 5/2004 | Mickle et al. |
| 2005/0112049 | A1 | 5/2005 | Hofmeister |
| 2005/0214198 | A1 | 9/2005 | Park et al. |
| 2007/0240757 | A1 | 10/2007 | Ren et al. |
| 2009/0128893 | A1 | 5/2009 | McCarthy et al. |
| 2010/0084475 | A1 | 4/2010 | Hata et al. |
| 2010/0244656 | A1* | 9/2010 | Ito ................. H01Q 1/2283 313/358 |
| 2010/0263709 | A1* | 10/2010 | Norman ............... F24S 25/12 136/246 |
| 2010/0284086 | A1 | 11/2010 | Novack et al. |
| 2011/0121258 | A1 | 5/2011 | Hanein et al. |
| 2011/0163920 | A1 | 7/2011 | Cutler |
| 2012/0186635 | A1 | 7/2012 | Eastman et al. |
| 2012/0206085 | A1 | 8/2012 | Stevens |
| 2012/0211063 | A1 | 8/2012 | Lee et al. |
| 2013/0249771 | A1* | 9/2013 | Kotter ................. H01Q 1/248 343/893 |
| 2013/0276861 | A1* | 10/2013 | Cooke .................. H01L 31/09 136/246 |
| 2015/0130692 | A1 | 5/2015 | Cooke |
| 2015/0155396 | A1 | 6/2015 | Cooke et al. |
| 2015/0243817 | A1 | 8/2015 | Cooke et al. |
| 2016/0027949 | A1 | 1/2016 | Cooke et al. |

FOREIGN PATENT DOCUMENTS

| | | |
|---|---|---|
| FR | 2996681 A1 | 4/2014 |
| TW | 201110272 A | 3/2011 |
| WO | 2007120175 A2 | 10/2007 |
| WO | 2014063149 A1 | 4/2014 |

OTHER PUBLICATIONS

Extended European Search Report dated Sep. 7, 2018 in EP Application No. 15873906.0.
Extended European Search Report dated Oct. 15, 2018 in EP Application No. 16789760.2.
Office Action dated Sep. 18, 2018 in CN Application No. 201680025443.3.
Office Action dated Sep. 22, 2017 in U.S. Appl. No. 13/454,155, by Cooke.
Office Action dated Jan. 11, 2018 in U.S. Appl. No. 15/249,953, by Cooke.
Int'l Preliminary Report on Patentability dated Nov. 16, 2017 in Int'l Application No. PCT/US2016/029336.
Office Action dated May 29, 2018 in CN Application No. 2015800712314.
Office Action dated Feb. 27, 2018 in U.S. Appl. No. 15/411,396, by Cooke.
Office Action dated Mar. 9, 2018 in U.S. Appl. No. 15/133,807, by Cooke.
Collinear—Definition and More from the Free Merriam-Webster Dictionary, "http://www.merriam-webster.com/dictionary/collinear", 2014.
Rows—Definition and More from the Free Merriam-Webster Dictionary, "http://www.merriam-webster.com/dictionary/rows," 2014.
Siciliano et al., "Nano-Rectenna for High Efficiency Direct Conversion of Sunlight to Electricity," presented at 17th World Micromachine Summit, Apr. 26-29, 2011.
Williams, "Rice's carbon nanotube fibers outperform copper," at "http://news.rice.edu/2014/02/13/rices-carbon-nanotube-fibers-outperform-copper-2," posted Feb. 13, 2014.
Hata, "From Super Growth to DWNT forests, CNT solids, Flexible Transparent CNT films, and Super-Capacitors and Much More," Jun. 19, 2006.
Ma et al., "The production of horizontally aligned single-walled carbon nanotubes," Carbon, 49, pp. 4098-4110, 2011.
Kumar, "Chemical Vapor Deposition of Carbon Nanotubes: A Review on Growth Mechanism and Mass Production," Journal of Nanoscience and Nanotechnology, vol. 10, pp. 3739-3758, 2010.
Office Action dated Feb. 11, 2014 in U.S. Appl. No. 13/454,155.
Office Action dated Jun. 27, 2014 in U.S. Appl. No. 13/454,155.
Office Action dated Sep. 26, 2014 in U.S. Appl. No. 13/454,155.
Office Action dated Jan. 13, 2015 in U.S. Appl. No. 13/454,155.
Type—definition of type by The Free Dictionary, downloaded from web page: http://www.thefreedictionary.com/type, Download date: Mar. 9, 2015, original posting date: unknown, 1 page.
Office Action dated Mar. 17, 2015 in U.S. Appl. No. 13/454,155.
Int'l Search Report and Written Opinion dated Apr. 8, 2016 in Int'l Application No. PCT/US15/59852.
Int'l Search Report and Written Opinion dated Aug. 11, 2016 in Int'l Application No. PCT/US16/29336.
Office Action dated Nov. 14, 2016 in U.S. Appl. No. 14/582,747, by Cooke.
Office Action dated Dec. 29, 2016 in U.S. Appl. No. 15/133,807, by Gonzalez Ramos.
Office Action dated Apr. 5, 2017 in U.S. Appl. No. 14/582,747 by Cooke.
Office Action dated May 4, 2017 in U.S. Appl. No. 15/249,953, by Cooke.
Office Action dated Apr. 20, 2017 in U.S. Appl. No. 14/871,958, by Cooke.
Office Action dated Mar. 7, 2017 in U.S. Appl. No. 14/701,765, by Cooke.
Int'l Search Report and Written Opinion dated Jun. 20, 2017 in Int'l Application No. PCT/US2017/026130.
Office Action dated Jun. 8, 2017 in U.S. Appl. No. 14/701,765, by Cooke.
Int'l Preliminary Report dated Jul. 6, 2017 in PCT Application No. PCT/US2015/059852.
Office Action dated Jul. 3, 2017 in U.S. Appl. No. 15/133,807, by Cooke.
Office Action dated Jul. 27, 2017 in U.S. Appl. No. 15/411,396, by Cooke.

(56) References Cited

OTHER PUBLICATIONS

Office Action dated May 5, 2019 in CN Application No. 2015800712314.
Search Report dated Jul. 8, 2019 in TW Application No. 104137565.
Office Action dated Apr. 4, 2019 in U.S. Appl. No. 15/411,396.

* cited by examiner

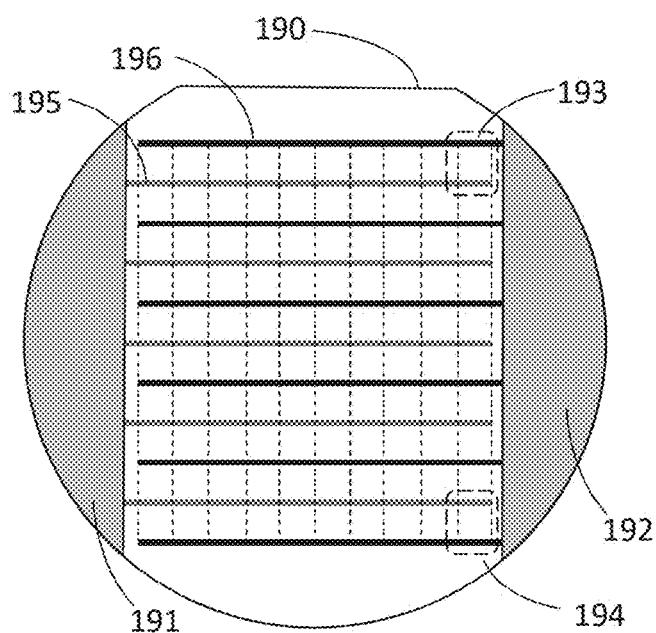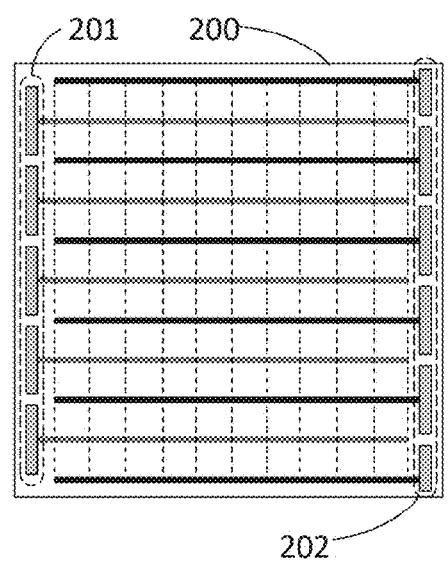
FIG. 19
FIG. 20

SOLAR ANTENNA ARRAY FABRICATION

CROSS-REFERENCE TO RELATED APPLICATIONS

This application is a continuation-in-part of U.S. patent application Ser. No. 15/411,396, filed on Jan. 20, 2017, which is a continuation-in-part of U.S. patent application Ser. No. 15/249,953, filed on Aug. 29, 2016, which is a continuation-in-part of U.S. patent application Ser. No. 15/133,807, filed on Apr. 20, 2016, all of which are incorporated herein by reference.

FIELD OF ENDEAVOR

Various aspects of this disclosure may pertain to economical manufacturing processes of visible light rectenna arrays for the conversion of solar energy to electricity.

BACKGROUND

Rectifiers for AC to DC conversion of high frequency signals have been well known for decades. A particular type of diode rectifier when coupled to an antenna, called a rectenna, has also been known for decades. More specifically, over 20 years ago, Logan described using an array of rectennas to capture and convert microwaves into electrical energy in U.S. Pat. No. 5,043,739 granted Aug. 27, 1991. However, the dimensions of the antenna limited the frequency until recently, when Gritz, in U.S. Pat. No. 7,679,957 granted Mar. 16, 2010, described using a similar structure for converting infrared light into electricity, and Pietro Siciliano suggested that such a structure may be used for sunlight in "Nano-Rectenna For High Efficiency Direct Conversion of Sunlight to Electricity," by Pietro Siciliano of The Institute for Microelectronics and Microsystems IMM-CNR, Lecce (Italy).

Still, the minimum dimensions required for such visible light rectennas are generally in the tens of nanometers. While these dimensions may be accomplished by today's deep submicron masking technology, such processing is typically far more expensive than the current solar cell processes, which require much larger dimensions.

Still, as Logan pointed out in U.S. Pat. No. 5,043,739, the efficiency of microwave rectennas can be as high as 40%, more than double that of typical single-junction poly-silicon solar cell arrays, and when using metal-oxide-metal (MOM) rectifying diodes, as Pietro suggests, no semiconductor transistors are needed in the array core.

As such, it may be advantageous to be able to utilize the existing fine geometry processing capability of current semiconductor fabrication without incurring the cost of such manufacturing.

Also, recently, Rice University reported that their researchers created a carbon nanotube (CNT) thread with metallic-like electrical and thermal properties. Furthermore, carbon nanotube structures are becoming more manufacturable, as described by Rosenberger et al. in U.S. Pat. No. 7,354,977 granted Apr. 8, 2008. Various forms of continuous CNT growth may have also been contemplated, such as Lemaire et.al. repeatedly harvesting a CNT "forest' while it is growing in U.S. Pat. No. 7,744,793 granted Jun. 29, 2010, and/or put into practice using techniques described by Predtechensky et al. in U.S. Pat. No. 8,137,653 granted Mar. 20, 2012. Grigorian et al. describes continuously pushing a carbon gas through a catalyst backed porous membrane to grow CNTs in U.S. Pat. No. 7,431,985 granted Oct. 7, 2008.

Furthermore, others have contemplated using CNTs for various structures such as Rice University's CNT thread as described in "Rice's carbon nanotube fibers outperform copper," by Mike Williams, posted on Feb. 13, 2014 at: news.rice.edu/2014/02/13/rices-carbon-nanotube-fibers-outperform-copper-2; magnetic data storage as described by Tyson Winarski in U.S. Pat. No. 7,687,160 granted Mar. 30, 2010; and in particular, antenna-based solar cells, as described by Tadashi Ito et al. in US Patent Publication 2010/0244656 published Sep. 30, 2010. Still, Ito et al. did not describe methods to inexpensively construct carbon nanotube solar antennas for efficient conversion of solar energy.

SUMMARY OF VARIOUS EMBODIMENTS

Various aspects of the present disclosure may relate to ways to manufacture structures of CNT rectenna arrays for converting sunlight into electricity, which may utilize a stamp made using current IC manufacturing techniques and self-aligning process steps, and which may be used to achieve the dimensions required for the antenna arrays.

The structure of the rectenna array may include an array of CNT antennas connecting a ground line to a voltage line through geometric diodes, formed by the tip of the carbon nanotube touching the metal on the voltage line. The antennas may be of varying lengths and orientations, distributed for maximum reception of the full spectrum of ambient sunlight, e.g., having ¼ wavelengths or harmonic multiples of ¼ wavelengths. Two ¼-wavelength antenna diode combinations may be coupled with low resistance carbon nanotube fuzz to full-wave rectify the received light. An array of such double diode-antenna structures may be connected both in rows and columns such that the ground line of one row of double-diode antenna structures is connected to the voltage line of the next row of double-diode antenna structures. The number of rows may determine the voltage generated by the array, and the number of columns may determine the current generated by the array. Multiple arrays may be connected in parallel to form a die. Multiple die may be connected together to form a module. Switches may be used to vary the number of rows and columns of the double-diode antenna structures in an array. Such switches may be constructed from geometric diodes, which may change from conducting electrons to conducting holes in the presence of an electric field.

In one aspect, the rectenna arrays may be constructed by a series of depositions from a glass base up to a plastic back such that the antennas collect light through the glass base. Bus bars, composed of some combination of aluminum, copper, silver, or some other suitable conducting, reflecting metal may further reflect the received or retransmitted light to be re-collected by the antennas. In one such series of depositions, silicon nitride, or some other non-adhesive oxide that the catalyst will not adhere to, and aluminum, or some other suitable non-magnetic metal, may be deposited, stamped and etched, leaving the non-adhesive oxide between metal lines of varying heights. Another oxide may be deposited on the top of the metal, and nickel, or some other magnetic metal such as cobalt or iron, may be deposited to form a thin layer of catalyst for growing the CNT antennas. Subsequently, the catalyst may be polished off the high spots of the metal across the entire top of the voltage lines and half of the ground lines leaving "beads" of catalyst between the non-magnetic metal, after which the residual catalyst on the non-adhesive oxide may be washed off. Optionally, the non-adhesive oxide may then be selectively etched. Later, the catalyst may be annealed to prepare the layer of catalyst for growing the CNT antennas.

In another aspect, a stamp may be constructed to pattern metals for selectively etching the structures necessary to create the CNT antenna array. Alternatively, the stamp may be used to directly pattern metal, or may be further used to pattern a drum for high volume continuous CNT antenna array manufacturing.

In yet another aspect, oxide may be grown subsequent to the growth of the CNTs anchoring the CNTs to the aluminum lines. Furthermore, a clear plastic sheet may separate metal bus bars from the CNT antennas. A laser may be used to form vias in the plastic sheet. The plastic sheet may be a polycarbonate sheet. Resist may be exposed by shining light through the glass, forming a self aligned separation for the blade spread power and ground bus bars. The bus bars may be comprised of aluminum and copper. A cover layer of plastic may also be deposited on the bus bars, thereby forming a fully encapsulated continuous roll of flexible solar cells.

BRIEF DESCRIPTION OF THE DRAWINGS

Various aspects of the present disclosure will now be described in connection with the attached drawings, in which:

FIG. 19 is a diagram of a wafer according to an aspect of the present disclosure, FIG. 20 is a diagram of a module according to an aspect of the present disclosure.

DESCRIPTION OF VARIOUS ASPECTS OF THE PRESENT DISCLOSURE

Various aspects of the present disclosure are now described with reference to FIG. 1 through FIGS. 27A-27B, it being appreciated that the figures may illustrate the subject matter of various aspects and may not be to scale or to measure.

Figure 1:
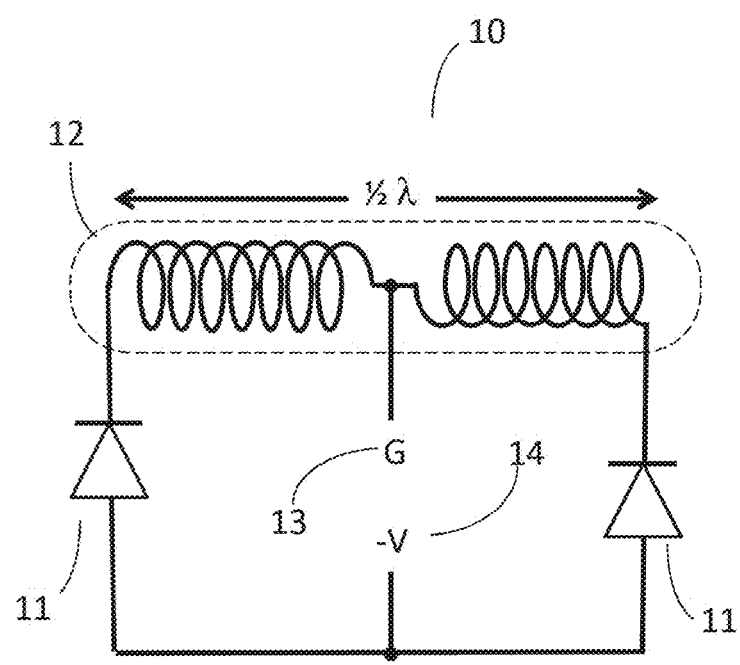
FIG. 1 is an electrical diagram of a double diode-antenna structure according to an aspect of the present disclosure.
Figure 2:
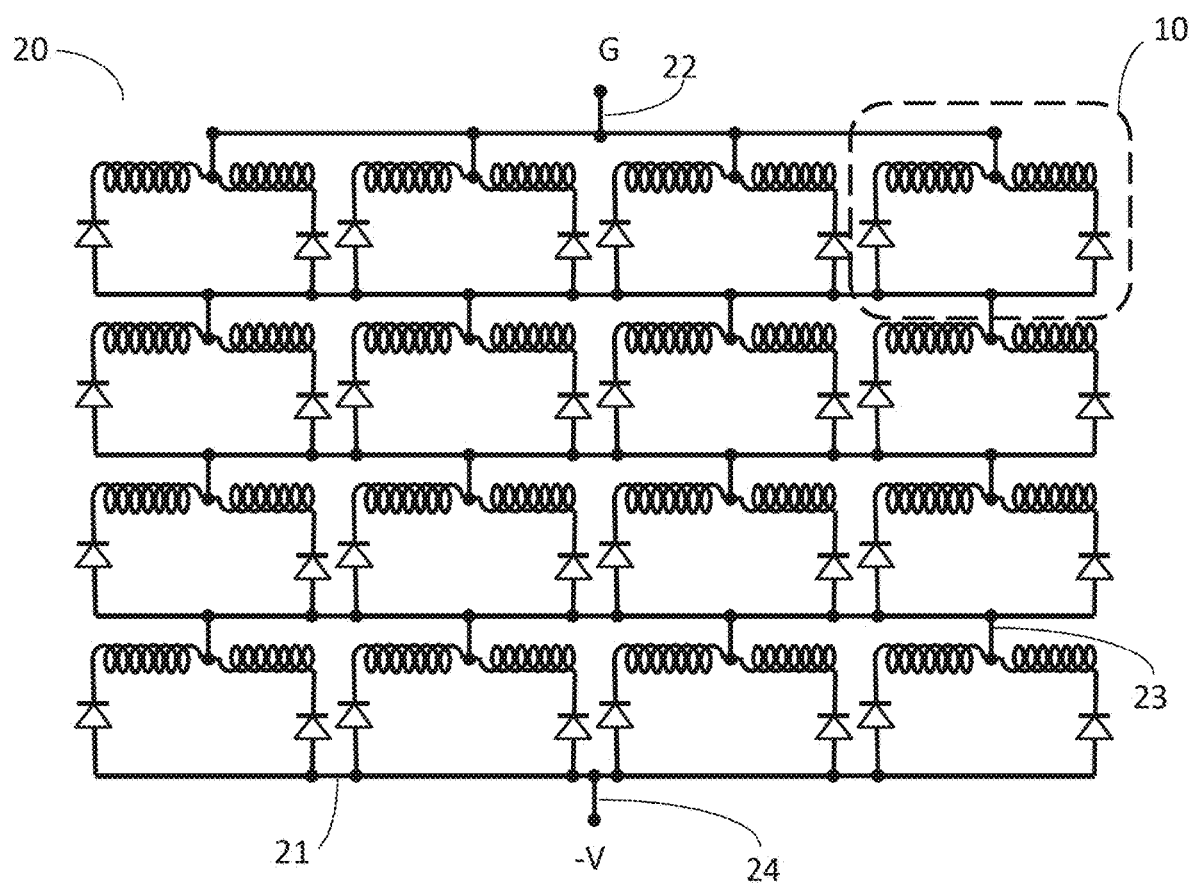
FIG. 2 is another electrical diagram of an array of double diode-antenna structures connected in rows and columns according to an aspect of the present disclosure.

An electrical diagram 10 of a double-diode antenna structure according to an aspect of the present disclosure is shown in FIG. 1. Two diodes 11 and a ½-wavelength antenna 12 may be coupled together, with the antenna 12 further connected to a ground line 13 and the diodes 11 connected to a voltage (−V) line 14, to form a full-wave rectified structure. Another electrical diagram 20 of an array of double-diode antenna structures connected in rows and columns, according to an aspect of the present disclosure, is shown in FIG. 2. Connectors 21 may connect double-diode antenna structures together in a row. Further connectors 23 between the ground lines and the voltage lines may connect double-diode antenna structures together in a column. Typically, the voltage of one double-diode antenna structure in full sunlight may be under −1 volt. In order to minimize the power losses due to the wire resistance, it may be desirable to increase the module's voltage and correspondingly reduce the module's current. By connecting multiple double-diode antenna structures in a column, their respective voltages may be added. Similarly, by connecting multiple double-diode antenna structures in a row, their respective currents may be added. In this manner, the voltage between the voltage pin 24 and the ground pin 22 may be determined by the number of double-diode antenna structures in each column, and the current on both the voltage and ground lines may be determined by the number of double-diode antenna structures in each row. It is further contemplated that a solar cell may be comprised of multiple arrays of double-diode antenna structures connected in parallel.

Figure 3:
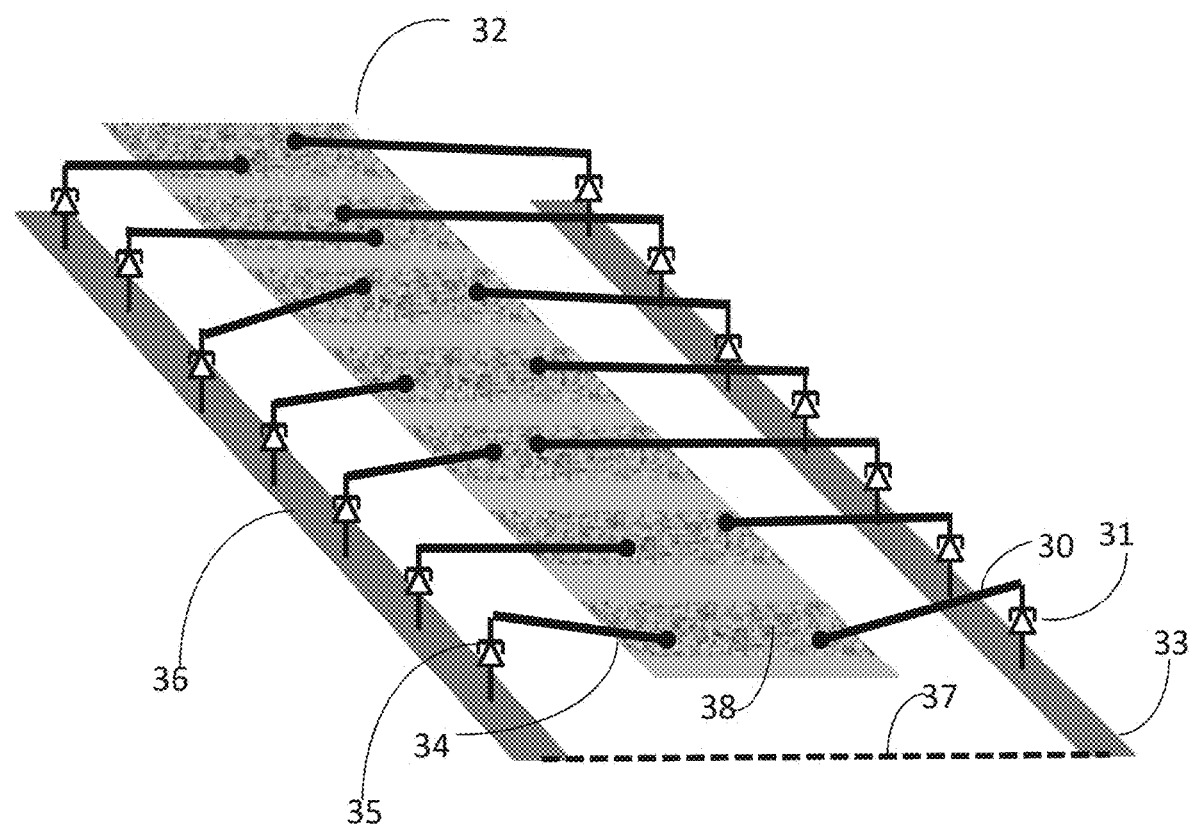
FIG. 3 is a logical diagram of an array of antennas and diodes according to an aspect of the present disclosure.

Reference is now made to FIG. 3, a conceptual diagram of an array of antennas and diodes according to an aspect of the present disclosure. The antenna 34 and diode 31 may be respectively connected to the ground line 32 and the voltage line 33, and a second antenna 34 and diode 35 may be respectively connected to another side of the ground line 32 and another voltage line 36, which may, in turn, be connected 37 to the original voltage line in a manner similar to the electrical diagram in FIG. 1. Together, the antennas 30, 34 may connect to the ground line and to each other through low resistance carbon nanotube fuzz 38. The antennas may be of varying lengths and may be randomly placed between the diodes and the ground line 32. The antennas may be metallic multi-walled carbon nanotubes.

Figure 4:
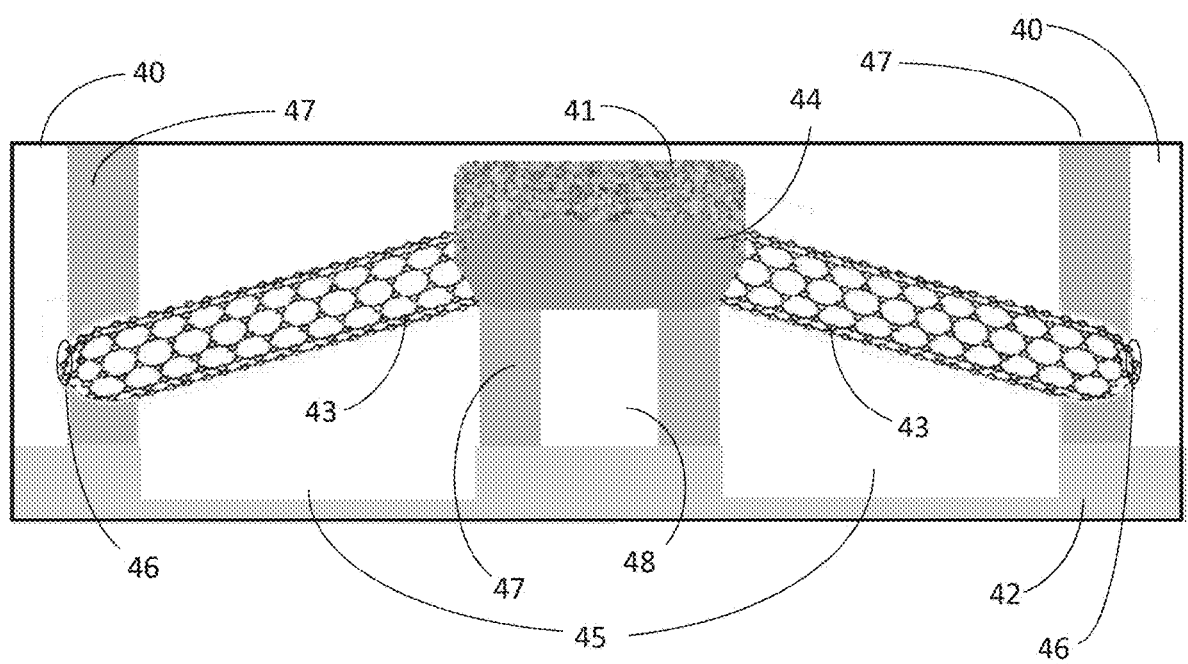
FIG. 4 is a diagram of a cross-section of a double diode and carbon nanotube antenna structure according to aspects of the present disclosure.

Reference is now made to FIG. 4, a diagram of the cross-section of a double-diode and carbon nanotube antenna structure according to aspects of the present disclosure. The antennas 43 may be multi-walled carbon nanotubes, which may be attached to the ground line 48 via a catalyst 44 and low resistance carbon nanotube fuzz 41. The catalyst may be used to grow the CNTs for both the fuzz and the antennas. The catalyst maybe composed of nickel, iron, cobalt, or some other suitable metal or alloy of metals. The catalyst 44 may be sufficiently wide enough to form multiple sites for carbon nanotube antennas and carbon nanotube fuzz. The tips 46 of the carbon nanotubes 43 may extend beyond the oxide layer 47, forming a direct contact between the carbon nanotube 43 and the metal 40. This structure may form a geometric diode coupling the carbon nanotube antennas 43 to the voltage line 40. A steep angle of connection (greater than 30 degrees) may reduce the effectiveness of the geometric diode. The voltage and ground lines may be insulated from each other via a base 42. The base 42 may be comprised, for example, of ceramic, glass or quartz material. The voltage 40 and ground 48 lines may be composed of one or more metals. Trenches 45 may be etched in the base 42.

In order to efficiently rectify visible light, the diodes may need to have a cutoff frequency above 700 THz, with forward bias voltages as close to zero volts as possible. This may require geometric diodes 46 with sufficiently small diameters connected to the voltage lines from sufficiently large enough diameter carbon nanotubes to maintain at least a 4:1 ratio of the carbon nanotube diameter to the diameter of the contact with the voltage line. Furthermore, the antennas' lengths and directions may vary to cover substantially the entire spectrum of un-polarized sunlight. This may be accomplished by varying the distance the carbon nanotubes 43 must cover from the ground 41 line to the voltage line 40, such that the difference of the shortest to the longest carbon nanotube may be greater than the difference between a ¼ wavelength of ultraviolet light (~80 nanometers) and ¼ wavelength of infrared light (~640 nanometers). This may ensure that at least one harmonic of substantially all frequencies of sunlight may be covered by the range of CNT lengths.

Such small structures may require the combination of complex semiconductor processing coordinated with controlled growth of carbon nanotube antennas. It may, therefore, be desirable to leverage as much of existing semiconductor processing as possible, and to modify the process to reduce cost and increase volume by eliminating all (or as many as possible) wafer handling and photolithographic operations, the most expensive aspects of semiconductor processing. Secondly, it may also be desirable to eliminate the need to align any structure formed in the process with any other structure subsequently formed later in the process. This may be accomplished, e.g., by only performing one stamping step.

Figure 5:
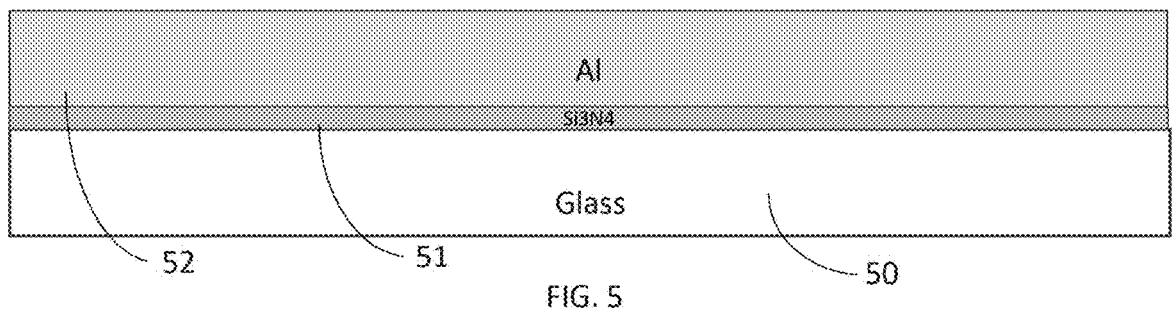
FIG. 5 through FIG. 11 are cross-sections of an end view of an antenna array during successive steps of manufacture according to one or more aspects of the present disclosure.

Reference is now made to FIG. 5, a cross-section of an end view of an antenna array during a first deposition step of manufacture according to one or more aspects of the present disclosure. In this case, a thin layer of silicon nitride 51 may be deposited on a glass base 50, followed by a thicker layer of aluminum 52.

Figure 6:
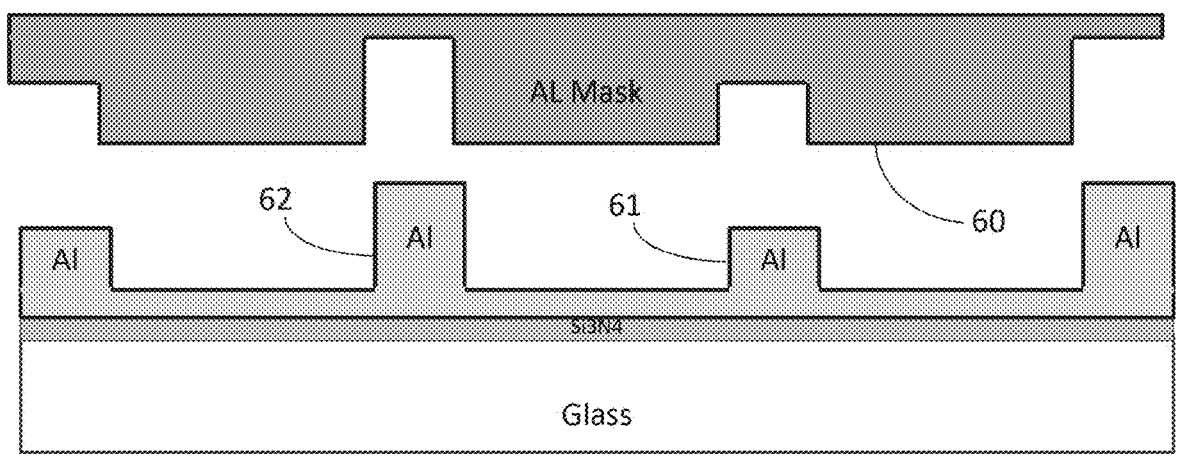
Figure 7:
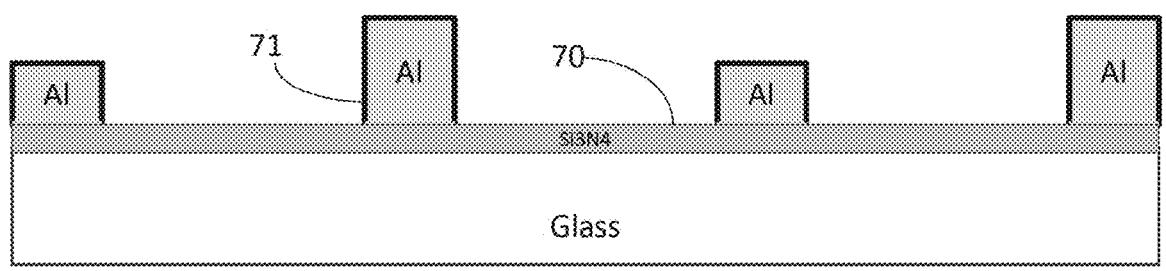
Figure 8:
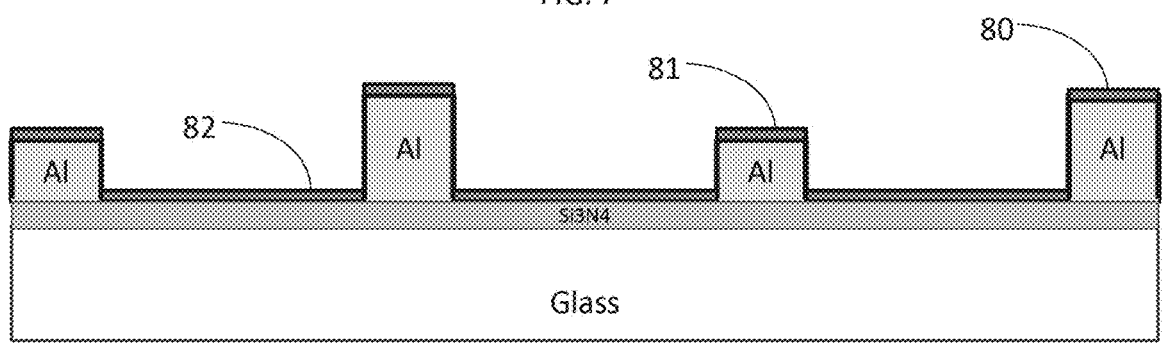
Figure 9:
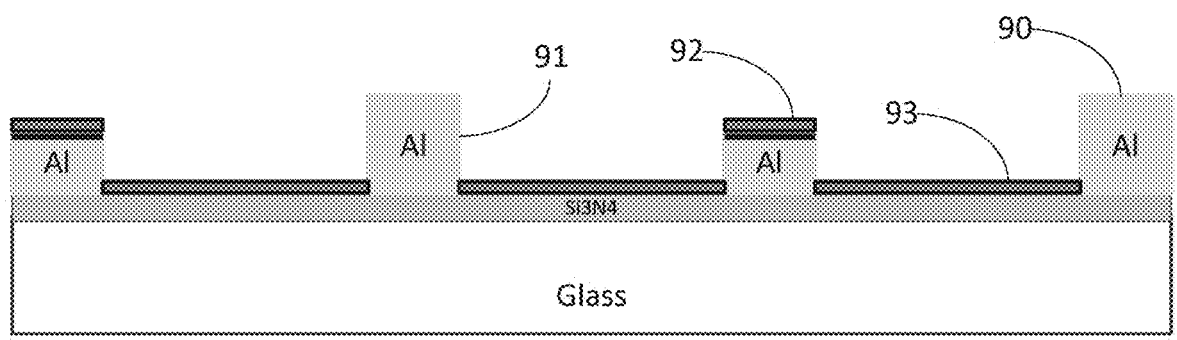
Figure 10:
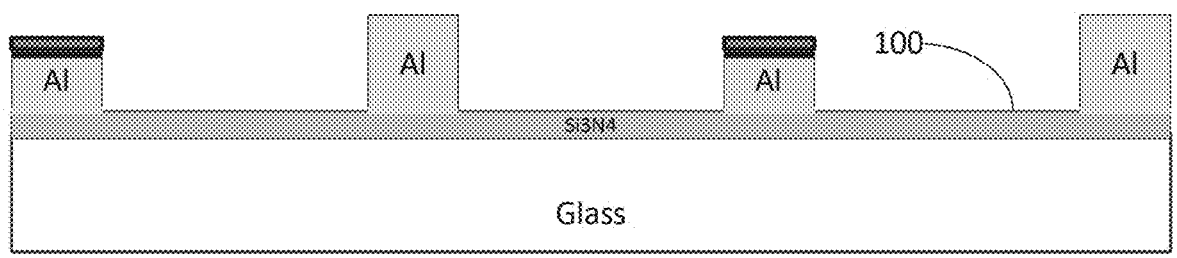
Figure 11:
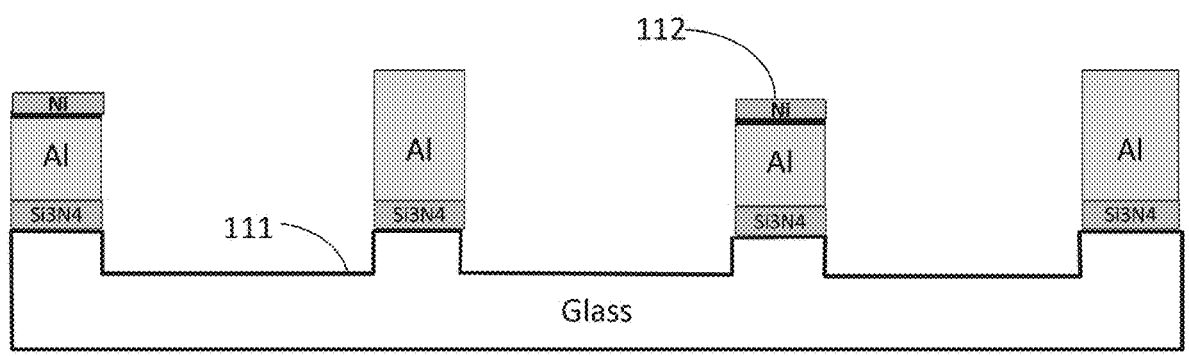

Reference is now made to FIG. 6, a cross-section of an end view of an antenna array during a stamping step of manufacture according to one or more aspects of the present disclosure. A mask or rotating patterned drum 60 may be pressed into the deposited aluminum 52 to form short ground lines 61 and tall voltage lines 62. The space between the lines may be at least a micron, to allow the CNTs grown between the metal lines to vary up to a ½ micron in length, and to maximize the CNT light absorption area, the metal lines may be as narrow as may be economically manufactured. In one embodiment, this may be the only stamping step, such that no alignment may be performed either to align this stamp to a prior step or to align a subsequent step to the pattern made by this stamp, thereby dramatically improving the yield and correspondingly reducing the cost of manufacture.

Reference is now made to FIG. 7 through FIG. 11, cross-sections of an antenna array during successive steps in manufacture according to an aspect of the present disclosure. The patterned aluminum may be etched down to the silicon nitride 70. The etch may be stopped by optical resolution of the pattern or measuring the resistance between the ground and voltage lines. Oxide 71 may then be grown on the remaining aluminum. Subsequently, nickel 80,81,82 may be deposited. Thereafter, the higher structures 90, 91 may be polished, e.g., with one or more rotating drums, which may thereby remove the nickel 80. Oxide 71 may be etched off the remaining uncovered structures 90, 91, and remaining nickel 92 may be annealed, followed by a wash to remove the nickel 93 from the silicon nitride 100. The anneal may more effectively connect the nickel to the aluminum ground lines. Optionally, a selective etch may then be performed to remove the exposed silicon nitride, thereby somewhat etching into the glass 111.

A "pump up" may then be performed to process the rest of the vacuum steps in a low vacuum. In addition, the anneal may be a combination of a reduction step using hydrogen or ammonia to reduce oxide from the layer of nickel 112, and a rapid thermal anneal (RTA) to convert the nickel layer into suitable nickel balls for carbon nanotube growth.

Figure 12:
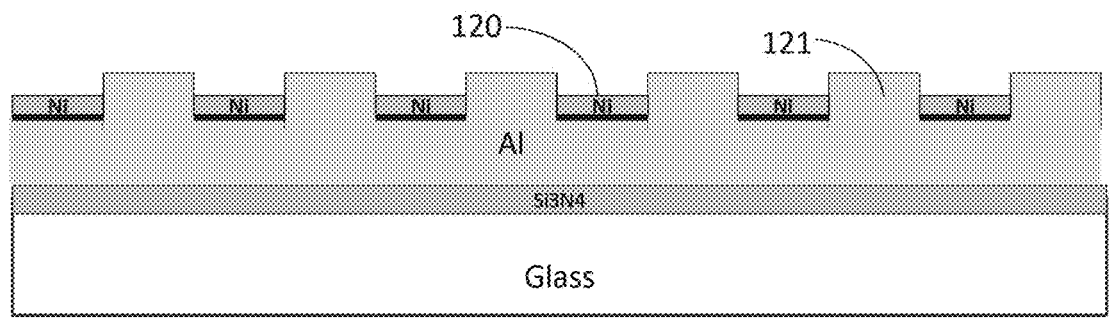
FIG. 12 is a diagram of a side view of beaded nickel lines during a step of manufacture, according to an aspect of the present disclosure.

Reference is now made to FIG. 12, a diagram of a side view of a beaded nickel line during a step of manufacture, according to an aspect of the present disclosure. The polishing may have removed the nickel from the higher aluminum structures 121 leaving "beads" of nickel 120 on aluminum oxide spaced between the higher aluminum 121.

Figure 13:
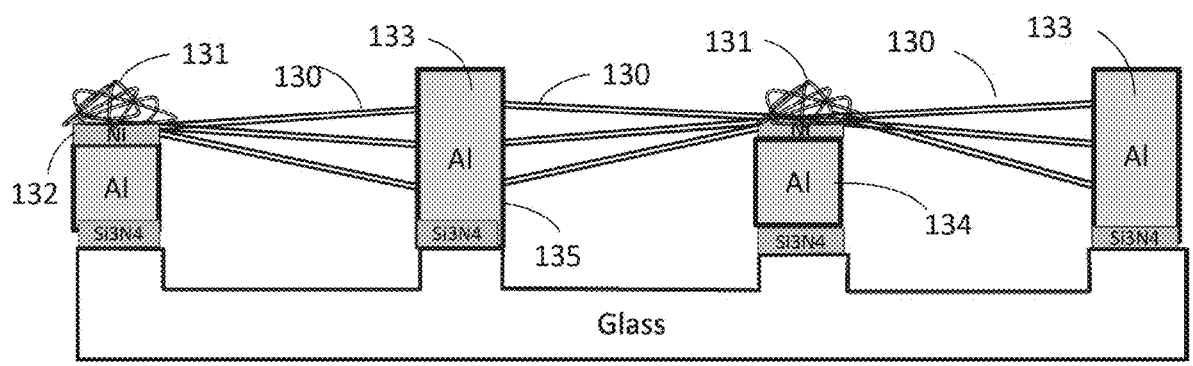
FIG. 13 is a cross-section of an end view of an antenna array during a successive step of manufacture according to one or more aspects of the present disclosure.

Reference is now made to FIG. 13, a cross-section of an end view of an antenna array during a successive step of manufacture according to one or more aspects of the present disclosure. Using a hydrocarbon gas and a hydrogen source in a controlled pressure and temperature environment, carbon nanotube antennas 130 may now be grown from the nickel catalyst 132 on the ground aluminum lines 134 to the aluminum 133 on the voltage lines, and the fuzz 131 may be grown on the nickel catalyst to connect pairs of the carbon nanotube antennas 130. Aluminum oxide 135 may then be grown around the carbon nanotube antennas, which may form geometric diodes.

The carbon nanotube growth may be performed by applying an electrical field between the ground lines 134 and the voltage lines 13.3. Furthermore, the current may be clamped and monitored to minimize the disconnection of the carbon nanotubes 130, which may bridge the gap between the ground lines 134 and the voltage lines 133.

To manufacture the geometric diodes, the carbon nanotubes 130 may be grown to aluminum on the voltage lines 133, which may not have aluminum oxide 135 on them. This step may be followed by an optional step to grow oxide 47 over all the aluminum lines, which may grow around the tips of the carbon nanotubes 46, as shown in FIG. 4.

Figure 14:
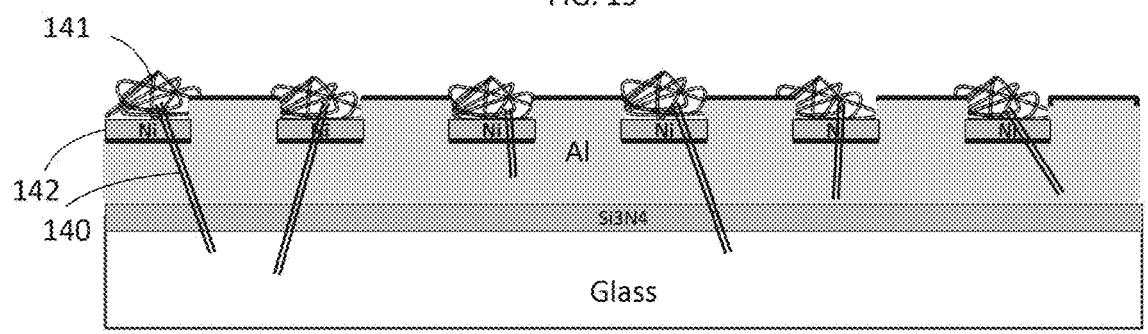
FIG. 14 is a diagram of a side view of beaded nickel lines during another step of manufacture, according to an aspect of the present disclosure.

Reference is now made to FIG. 14, a diagram of a side view of a beaded nickel ground line during another step of manufacture, according to an aspect of the present disclosure. The nickel beads 142 may be spaced sufficiently apart to keep the fuzz 141 on one nickel bead from touching the fuzz on adjacent nickel beads. The nickel beads 142 may be sized to grow multiple carbon nanotube antennas 140 from each side of a given nickel bead 142.

Figure 15:
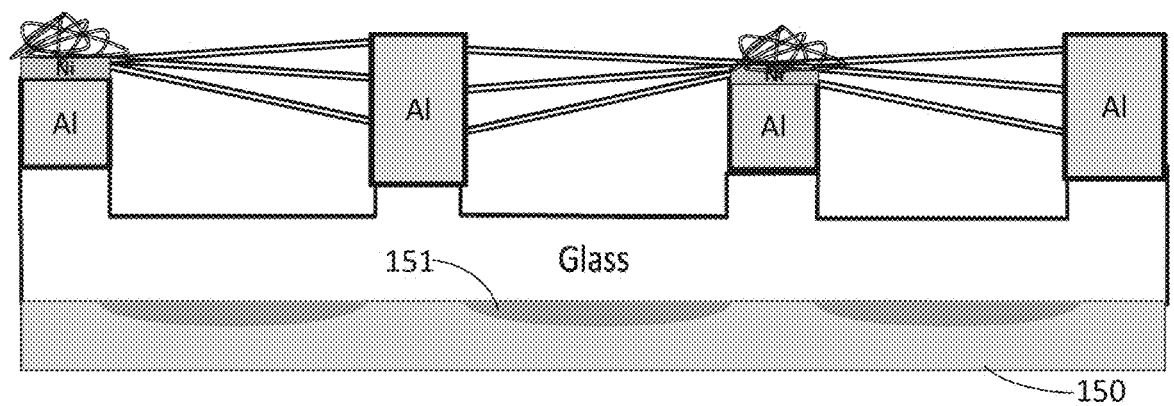
FIG. 15 through FIG. 17 are cross-sections of an end view of an antenna array during successive steps of manufacture, according to one or more aspects of the present disclosure.
Figure 16:
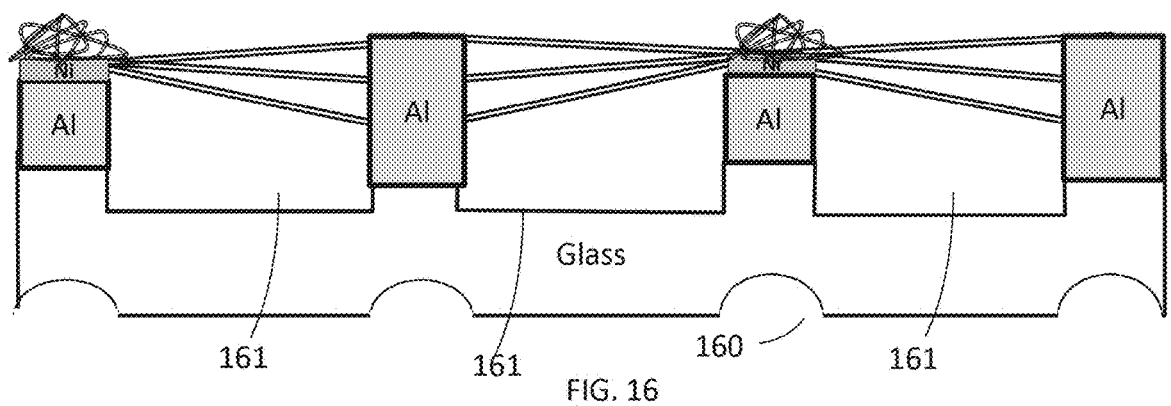
Figure 17:
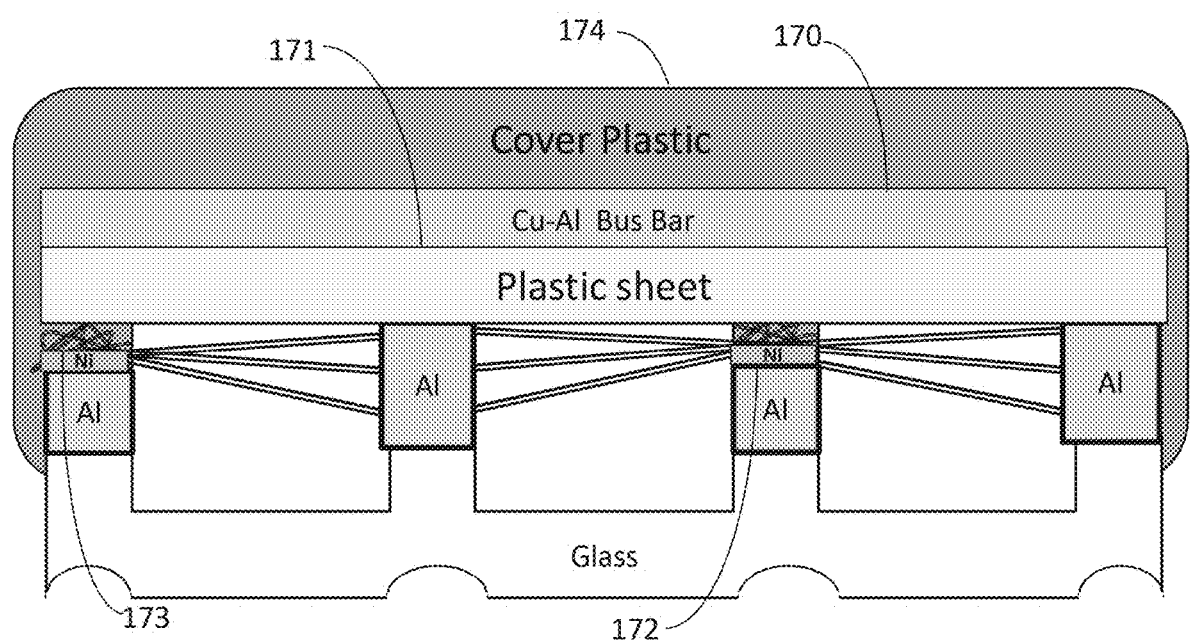

Reference is now made to FIG. 15 through FIG. 17, cross-sections of an end view of an antenna array during successive steps of manufacture, according to one or more aspects of the present disclosure. Subsequent to the carbon nanotube growth, a negative resist may be sprayed onto the bottom glass surface 150 and exposed 151 from above through the glass. After washing the unexposed resist away, the exposed resist 151 may remain, protecting the glass. Etching the bottom of the glass may create lenses 160 that may disperse the light towards the trenches 161. Thereafter, a plastic sheet 171 may be attached on top of the power lines, leaving room for the nickel 172 and CNT fuzz. Thicker copper aluminum may be spread on the plastic sheet to form bus bars which may be connected to the power and ground lines. The plastic sheet 171 may be a polycarbonate sheet. Finally, cover plastic 174 may be sprayed on and dried to seal the solar cell. The solar cell may be turned over for normal operation.

Figure 18:
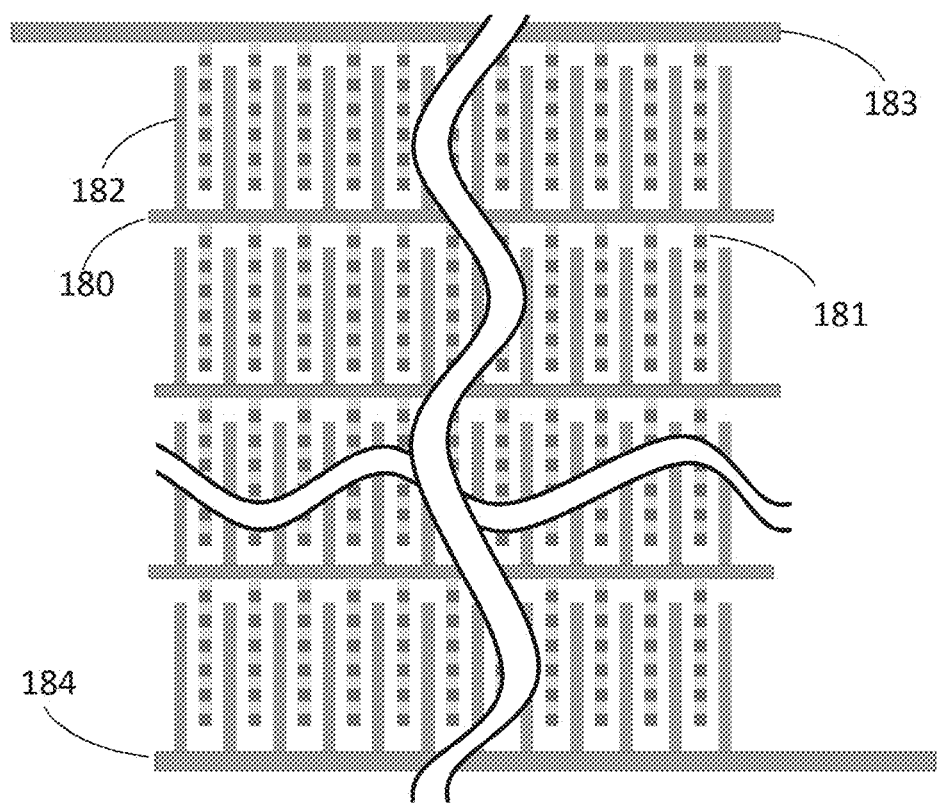
FIG. 18 is a top view of an array of beaded nickel and aluminum lines forming multiple rows and columns of double-diode antenna structures according to an aspect of the present disclosure.
Figure 21A:
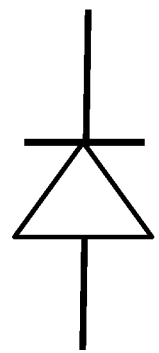
FIGS. 21A and 21B are a geometric diode symbol and IV curve with ballistic electron transport.
Figure 21B:
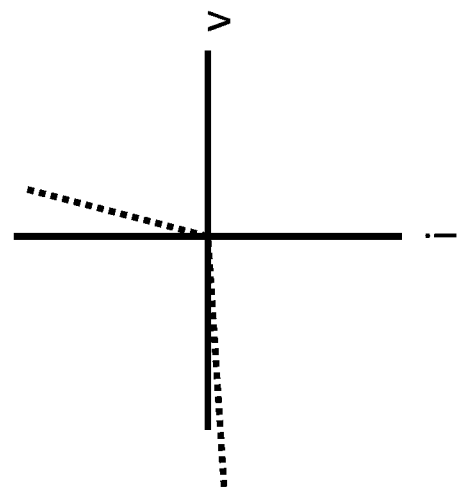
Figure 22A:
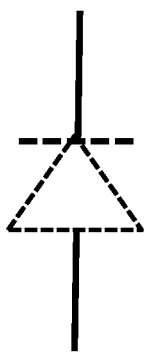
FIGS. 22A and 22B are a geometric diode symbol and IV curve with ballistic hole transport.
Figure 22B:
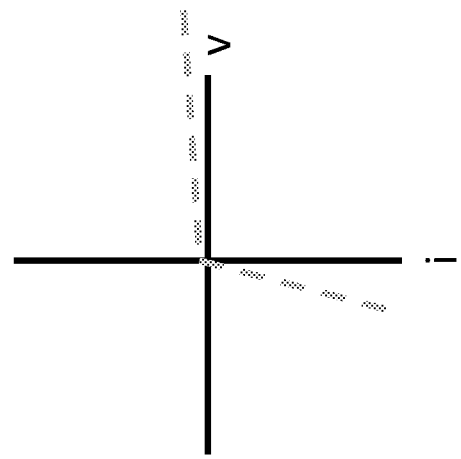
Figure 24A:
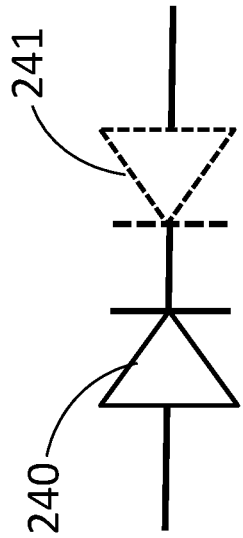
FIGS. 24A and 24B are a symbol and IV characteristic for a pair of opposing geometric diodes, one with ballistic electron transport and one with ballistic hole transport.
Figure 24B:
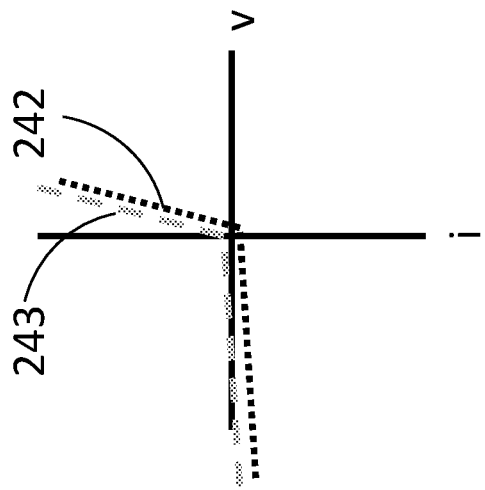
Figure 25:
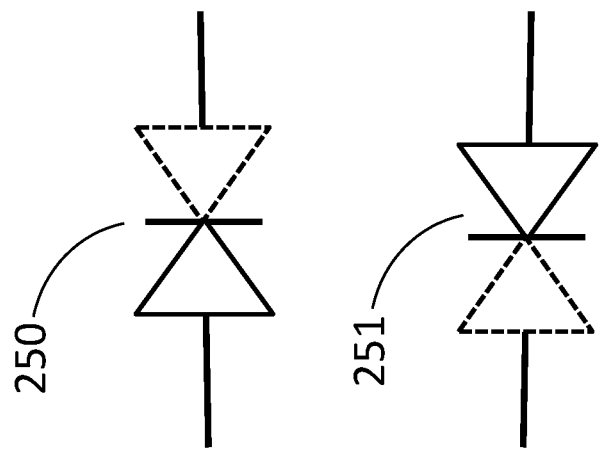
FIG. 25 is a condensed symbol for the pair of geometric diodes in FIGS. 23 and 24.
Figure 23A:
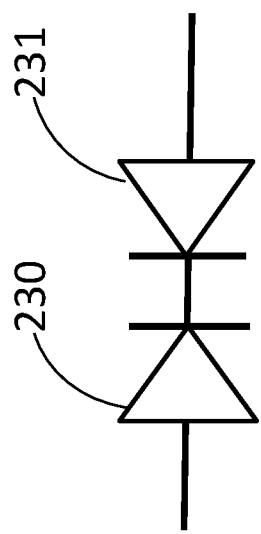
FIGS. 23A and 23B are a symbol and IV characteristic for a pair of opposing geometric diodes.
Figure 23B:
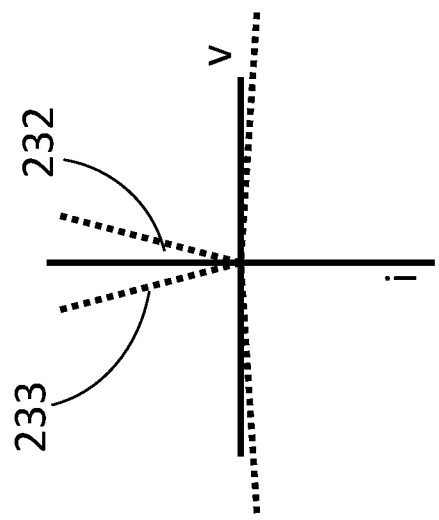

Reference is now made to FIG. 18, a top view of an array of beaded nickel and aluminum lines forming multiple rows and columns of double-diode antenna structures according to an aspect of the present disclosure. Each intermediate line 180 may connect voltage lines 182 to beaded nickel ground lines 181, and may start with a larger ground line 183 and end with a larger power line 184, both of which may connect to respective sides of the wafer or module. In this manner the voltage may be determined by the number of intermediate lines 180 connected between the top ground line 183 and bottom power line 184, and the current may be determined by the number of smaller voltage lines 182 and ground lines 181 in parallel.

Reference is now made to FIG. 19, a diagram of a wafer according to an aspect of the present disclosure. A quartz or glass wafer may consist of multiple die 193,194 in opposite orientations, which may merge their respective power lines 195 and ground lines 196 together, which in turn may be connected to large power 191 and ground 192 pads on the wafer. Each die may consist of multiple arrays of double-diode structures.

Reference is now made to FIG. 20, a diagram of a module according to another aspect of the present disclosure. The wafer shown in FIG. 19 may be cut into a module 200, and the power and ground pads may be cut into multiple power 201 and ground 202 pads, such that individual shorted sections may be detected and removed.

Reference is now made to FIG. 21A through 25, symbols and current-voltage (IV) curves for individual geometric diodes and pairs of opposing geometric diodes, one with ballistic electron transport and one with ballistic hole transport. A geometric diode 46, as shown in FIG. 4, may have a zero volt positive "turn-on" and may be in a mode of ballistic transport of electrons as shown in FIG. 21B. Under the presence of an adequate perpendicular electric field, a geometric diode may have a zero-volt negative "turn-on" and may be in a mode of hole transport as shown in FIG. 22B. By combining two opposing geometric diodes, 230, 231, current may be "turned-off" as shown by the IV curves 232 and 233 in FIG. 23B corresponding to the functions of diodes 230 and 231. Similarly, as shown in FIGS. 24A and 24B, by applying an adequate electric field to one 241 of a pair of opposing geometric diodes may transport holes corresponding to the IV curve 243, while the other 240 may transport electrons corresponding to the IV curve 242, both of which may have a zero volt positive "turn-on" as shown in FIG. 24B. A symbol 250 in FIG. 25 may be used to symbolize a diode switch that may be formed by combining such opposing geometric diodes to conduct current from left to right. It is further contemplated that the 251 may symbolize the reverse of symbol 250, and may be used to symbolize a diode switch which may "turn-on" in the opposite direction, with respect to the direction of symbol 250 to conduct current from right to left. It is also contemplated that by applying adequate electric fields to both diodes, they will both "turn-off," in a manner similar but opposite to the pair of diodes shown in FIG. 23A.

Figure 26:
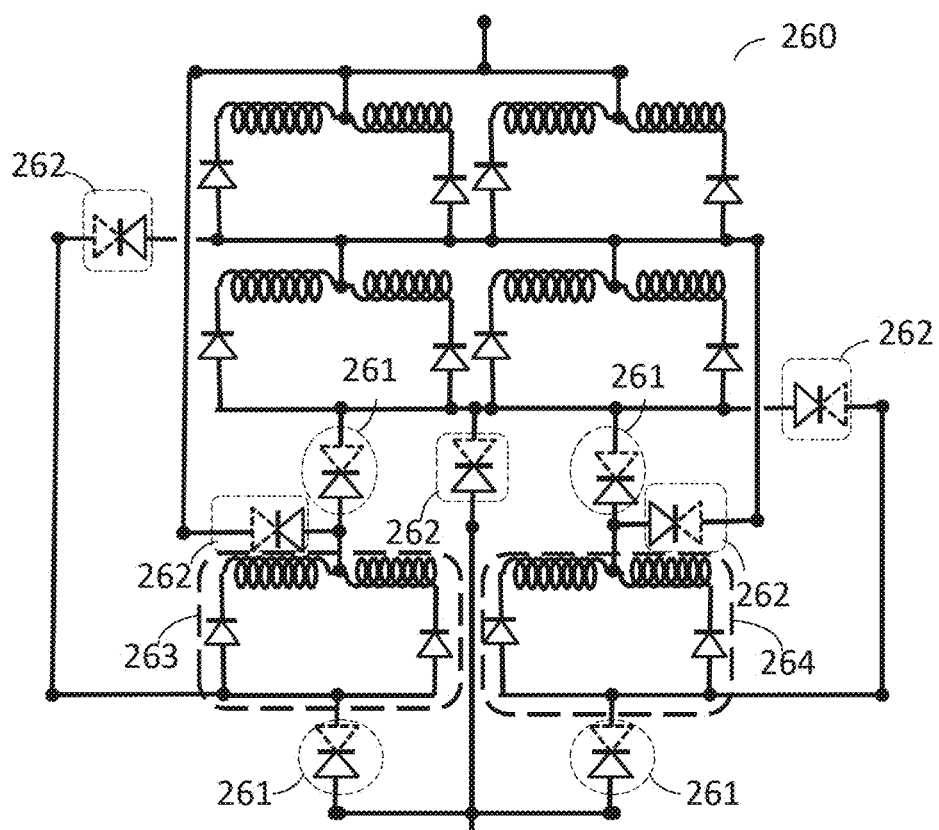
FIG. 26 is an electrical diagram of a reconfigurable array of double diode-antenna structures connected in rows and columns according to an aspect of the present disclosure.
Figure 27A:
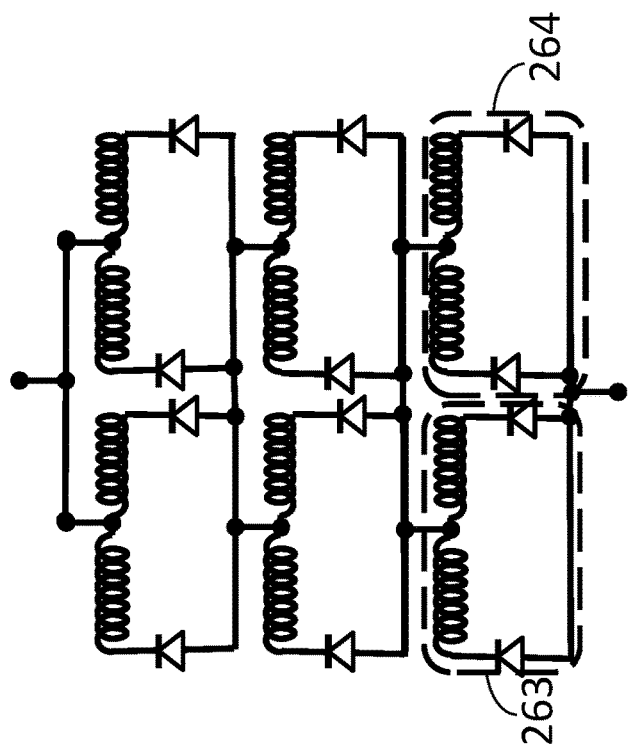
FIGS. 27A and 27B are two configurations of the array of double diode-antenna structures in FIG. 26.
Figure 27B:
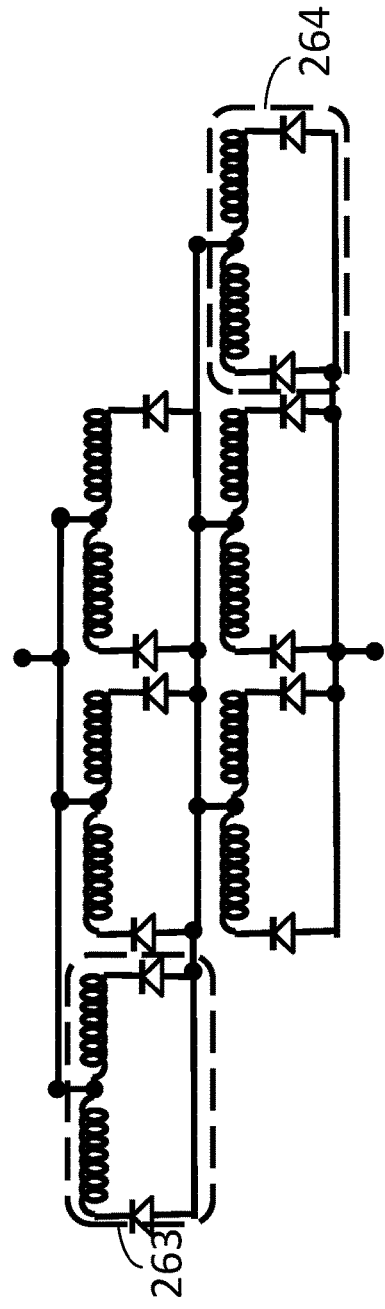

Reference is now made to FIG. 26, an electrical diagram of a reconfigurable array of double-diode antenna structures connected in rows and columns according to an aspect of the present disclosure. A solar cell may be comprised of many such arrays 260 connected in parallel. When one such array is in lower light than other arrays on the solar cell, a lower voltage may be generated by the array in low light. Current may be cut off from the lower voltage arrays when combined with higher voltage arrays. As such, it may be useful to either reduce the voltage of the higher voltage array or increase the voltage of the lower voltage array by changing the number of rows and columns in arrays 260. "Turning-on" one set of switches 261 and "turning off" another set of switches 262, may connect the double diode antenna structures 263 and 264 in a manner equivalent to the array shown in FIG. 27A. Similarly, by "turning-on" the set of switches 262, and "turning off" the other set of switches 261 may connect the double-diode antenna structures 263 and 264 in a configuration similar to the array shown in FIG. 27B. When the arrays are all in high light, they may be configured in a manner similar to the array shown in FIG. 27B. When one or more arrays are in low light they may be reconfigured in a manner shown in FIG. 27A. By increasing the number of rows in each of the arrays subjected to low light, the voltage from the arrays may be raised to match the voltages of the arrays in high light. It is further contemplated that other such connections may be performed with the switches 250 and 251 in FIG. 25, to perform row and column changes to balance the voltage of all the arrays in a solar cell.

It will be appreciated by persons skilled in the art that the present invention is not limited by what has been particularly shown and described hereinabove. Rather the scope of the present invention includes both combinations and subcombinations of various features described hereinabove as well as modifications and variations which would occur to persons skilled in the art upon reading the foregoing description and which are not in the prior art.

We claim:

1. A solar antenna array configured to convert sunlight into electrical energy comprising:
   a glass sheet;
   a plurality of parallel ground lines under the glass sheet;
   a plurality of parallel voltage lines under the glass sheet;
   a clear insulating sheet under the parallel ground lines and the parallel voltage lines;
   a power bus bar under the clear insulating sheet;
   a ground bus bar under the clear insulating sheet;
   a plurality of carbon nanotubes forming fuzz on the ground lines;
   a plurality of carbon nanotube antennas connected between adjacent voltage and ground lines of the plurality of parallel voltage lines and the plurality of parallel ground lines, respectively; and
   a plurality of diodes;
   wherein the plurality of parallel ground lines are alternatingly interleaved with the plurality of parallel voltage lines,
   wherein each of the plurality of parallel ground lines is electrically connected to the ground bus bar, wherein each of the plurality of parallel voltage lines is electrically connected to the power bus bar, wherein each of the respective carbon nanotube antennas is coupled to a ground line and, through a respective one of the plurality of diodes, to a voltage line, and wherein two or more of the carbon nanotube antennas are electrically connected directly to each other by the fuzz.

2. The solar antenna array in claim 1, wherein the plurality of carbon nanotube antennas vary in length and orientation for reception of multiple wavelengths of sunlight through the glass layer and reflected off the power bus bar and the ground bus bar.

3. The solar antenna array in claim 2, wherein one or more of the plurality of diodes are geometric diodes.

4. The solar antenna array in claim 3, wherein the geometric diodes are formed by the contacting the tip of the carbon nanotube to the metal voltage line with a diameter that is at least ¼ of the diameter of the carbon nanotube.

5. The solar antenna array in claim 2, wherein the two or more of the carbon nanotube antennas are connected to at least two different consecutive ones of the parallel voltage lines.

6. The solar antenna array in claim 1, wherein the glass sheet includes two or more lenses above the plurality of parallel ground lines and the plurality of parallel voltage lines, wherein the two or more lenses are configured to disperse light passing through the glass sheet above the plurality of parallel ground lines and the plurality of parallel voltage lines to the plurality of carbon nanotube antennas.

7. A reconfigurable array of double-diode structures comprising:
   a plurality of double-diode structures, organized in an array of rows and columns, each double-diode structure containing a power line and a ground line; and
   a plurality of switches, each containing a pair of opposing geometric diodes that are distinct from the diodes of the plurality of double-diode structures;
   wherein in each row the ground lines of the double diode structures are connected together, in each row the power lines of the double diode structures are connected together, in each column the ground line of each double diode structure is connected to the power line of an adjacent double diode structure, and the switches connect each of the double diode structures in at least one row to other rows.

8. The reconfigurable array of double-diode structures as in claim 7, wherein in a first mode the switches are not conducting, in a second mode the switches are conducting in a first direction, and in a third mode the switches are conducting in a second direction opposite to the first direction.

* * * * *